(12) United States Patent  
Hsu et al.

(10) Patent No.: US 9,780,230 B2  
(45) Date of Patent: Oct. 3, 2017

(54) SEMICONDUCTOR STRUCTURE WITH OXIDE SEMICONDUCTOR LAYER

(71) Applicant: UNITED MICROELECTRONICS CORP., Hsin-Chu (TW)

(72) Inventors: Chia-Fu Hsu, Tainan (TW); Chun-Yuan Wu, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/368,647

(22) Filed: Dec. 4, 2016

(65) Prior Publication Data

US 2017/0141232 A1     May 18, 2017

Related U.S. Application Data

(62) Division of application No. 14/929,396, filed on Nov. 1, 2015, now Pat. No. 9,543,448.

(30) Foreign Application Priority Data

Aug. 26, 2015   (TW) .............................. 104127820 A

(51) Int. Cl.
| | |
|---|---|
| *H01L 29/10* | (2006.01) |
| *H01L 29/786* | (2006.01) |
| *H01L 29/66* | (2006.01) |
| *H01L 29/40* | (2006.01) |
| *H01L 29/45* | (2006.01) |

(52) U.S. Cl.
CPC ........ *H01L 29/7869* (2013.01); *H01L 29/401* (2013.01); *H01L 29/45* (2013.01); *H01L 29/66969* (2013.01); *H01L 29/78696* (2013.01)

(58) Field of Classification Search
CPC ...................... H01L 29/7869; H01L 29/78696
USPC ........................................................... 257/43
See application file for complete search history.

(56) References Cited

U.S. PATENT DOCUMENTS

| | | |
|---|---|---|
| 9,035,297 B2 | 5/2015 | Park |
| 2014/0246711 A1 | 9/2014 | Amari |
| 2015/0021572 A1 | 1/2015 | Amari |
| 2015/0179810 A1 | 6/2015 | Yamazaki |

*Primary Examiner* — Anthony Ho

(74) *Attorney, Agent, or Firm* — Winston Hsu

(57) ABSTRACT

The present invention provides a semiconductor structure, including a base, a patterned oxide semiconductor (OS) layer, two source/drain regions, a protective layer, a gate layer and a gate dielectric layer. The patterned OS layer is disposed on the base. Two source/drain regions are disposed on the patterned OS layer and are separated by a recess. Each source/drain region includes an inner sidewall facing the recess and an outer sidewall opposite to the inner sidewall. The protective layer is disposed on a sidewall of the patterned OS layer but is not on the inner sidewall of the source/drain region. The gate layer is disposed on the patterned OS layer, and the gate dielectric layer is disposed between the gate layer and the patterned OS layer.

10 Claims, 8 Drawing Sheets

US 9,780,230 B2

SEMICONDUCTOR STRUCTURE WITH OXIDE SEMICONDUCTOR LAYER

CROSS REFERENCE TO RELATED APPLICATIONS

This application is a Divisional of application Ser. No. 14/929,396 filed on Nov. 1, 2015, and included herein by reference.

BACKGROUND OF THE INVENTION

1. Field of the Invention

The present invention relates to a semiconductor structure, and more particularly, to a semiconductor structure having an oxide semiconductor layer.

2. Description of the Prior Art

In the modern society, the micro-processor systems comprising integrated circuits (IC) are ubiquitous devices, being utilized in diverse fields such as automatic control electronics, mobile communication devices and personal computers. With the development of technology and the increase of original applications for electronical products, the IC devices are becoming smaller, more delicate and more diversified.

In a wide variety of materials, indium oxide ($In_2O_3$), tin oxide ($SnO_2$) and zinc oxide (ZnO) are generally known transparent conductive oxide. Indium tin oxide is (ITO), when being formed of a thin film, can be used as a transparent electrode in a flat panel display or a touch sensor of a capacitance type touch panel. Tin oxide and zinc oxide can be used in a transparent solar cell electrode. However, these materials are essentially semiconductor material, and it is desired for the researchers to develop a semiconductor device by using their semiconductor material property, such as an oxide semiconductor transistor.

However, due to oxidation of the semiconductor material itself, when using of this oxide semiconductor material, it is easy to damage the oxide semiconductor layer during the production process, thus affecting the performance of the product. Therefore, for a semiconductor device having an oxide semiconductor material, there is still a need for a better design or a manufacturing method, thereto gain better quality.

SUMMARY OF THE INVENTION

The present invention therefore provides a semiconductor structure and a method of forming the same, in order to obtain a better product performance.

According to one embodiment, the present invention therefore provides a semiconductor structure, including a base, a patterned oxide semiconductor (OS) layer, two source/drain regions, a protective layer, a gate layer and a gate dielectric layer. The patterned OS layer is disposed on the base. Two source/drain regions are disposed on the patterned OS layer and are separated by a recess. Each source/drain region includes an inner sidewall facing the recess and an outer sidewall opposite to the inner sidewall. The protective layer is disposed on a sidewall of the patterned OS layer but is not on the inner sidewall of the source/drain region. The gate layer is disposed on the patterned OS layer, and the gate dielectric layer is disposed between the gate layer and the patterned OS layer.

According to another embodiment, the present invention further provides a method of forming the abovementioned semiconductor structure. First, a patterned oxide semiconductor (OS) layer and a patterned conductive layer are formed on a base. A protective layer is formed on the base, wherein the protective layer is disposed at least on a sidewall of the patterned oxide semiconductor layer. Next, the patterned conductive layer is patterned to form two source/drain regions, wherein the two source/drain regions are separated by a recess, and each source/drain region respectively comprises an inner sidewall facing the recess and an outer sidewall disposed opposite to the inner sidewall, and the protective layer is not disposed on the inner sidewall of the source/drain region. Then, a gate layer and a gate dielectric layer are formed on the patterned OS layer.

In the method set forth in the present invention, it is one salient feature that an additional oxygen treating is performed thereto improve the quality of OS layer which is used as a channel. Thus, the oxygen-vacancy problem in conventional arts can be avoided. In addition, the present invention further provides the protective layer at sidewall of the OS layer thereto protect damage of the OS layer in the subsequent etching process, thereby improving the reliability of the products.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
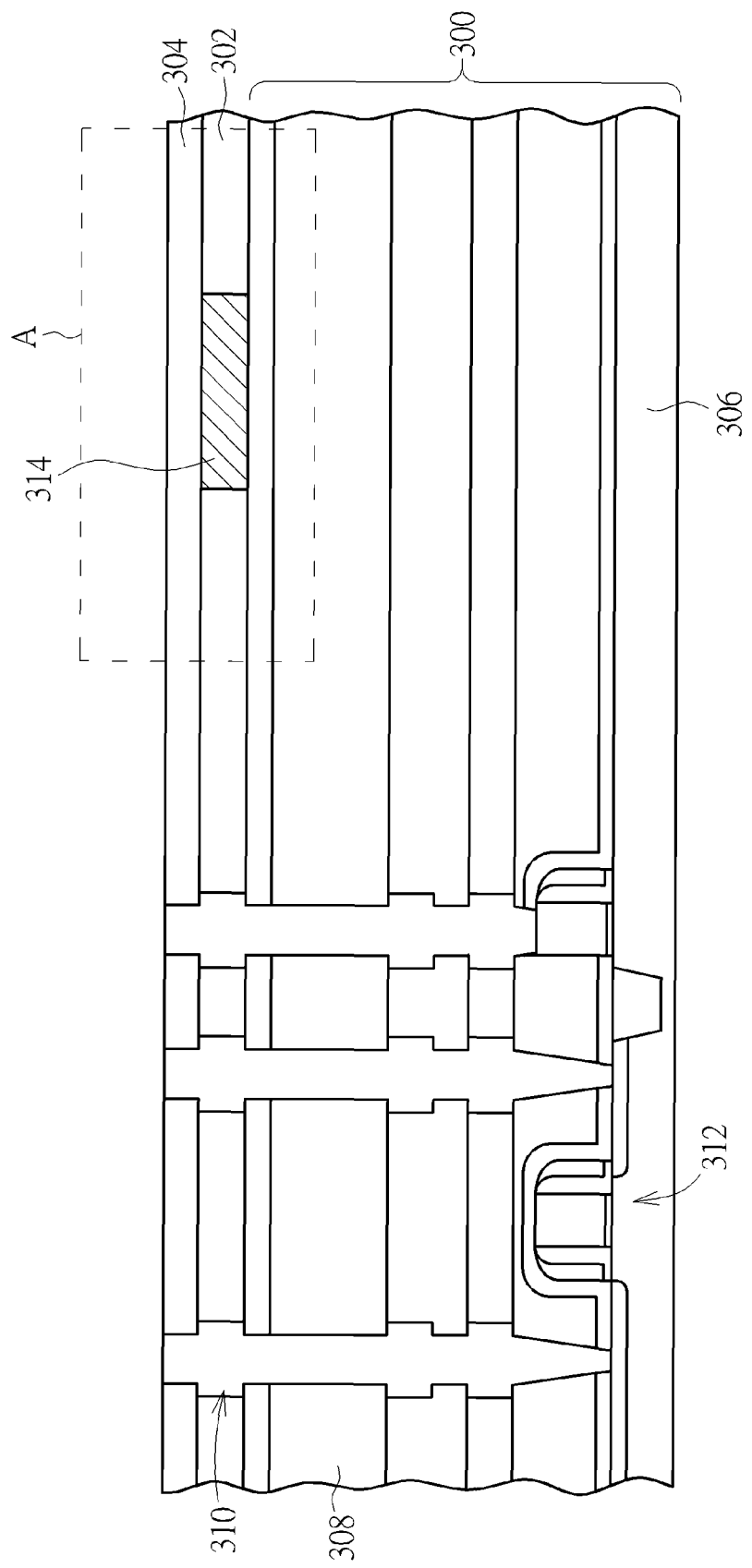
FIG. 1 to FIG. 9 show schematic diagrams of the method of forming a semiconductor structure according to one embodiment of the present invention.

Please refer to FIG. 1 to FIG. 9, showing schematic diagrams of the method of forming a semiconductor structure according to one embodiment of the present invention. As shown in FIG. 1, a base 300 with a first dielectric layer 302 and a second dielectric layer 304 disposed therein is provided. In one embodiment, as shown in FIG. 1, the base 300 may comprise a substrate 306 having a semiconductor material, for example, the substrate 306 can be a silicon substrate, an epitaxial silicon substrate, a silicon germanium substrate, a silicon carbide substrate, a single crystal silicon substrate, a single crystal silicon germanium substrate, an amorphous silicon substrate, or a silicon on insulator (SOI), but it is not limited thereto. In one embodiment, as shown in FIG. 1, one or more than one dielectric layer 308 can be disposed between the substrate 306 and the first dielectric layer 302, and a metal interconnection system 310 is disposed in the dielectric layers 308. In one embodiment, an electronic component 312 can be disposed in the substrate 306 or the dielectric layer 308. The electronic component 312 may be any active components such as a complementary metal oxide semiconductor (CMOS) or a photo-diode; alternatively, it may be any passive components such as an inductor, a capacitor or a resistor, and is not limited thereto. The electronic component 312 may receive or transmit various input/output signal through the metal interconnection system 310.

As shown in FIG. 1, a patterned conductive layer 314 is disposed in the first dielectric layer 302. The patterned conductive layer 314 may have any predetermined pattern. In one embodiment, the material thereof comprises a metal which can be formed by any metallization process. Thus, the patterned conductive layer 314 and the metal interconnection system 310 can be formed simultaneously. In one embodiment, the material of the patterned conductive layer 314 comprises gold (Au), silver (Ag), copper (Cu), aluminum (Al), molybdenum (Mo), titanium (Ti), tantalum (Ta), cadmium (Cd), a nitride thereof, an oxide thereof, alloys thereof, or a combination thereof. In one embodiment, the patterned conductive layer 314 can be electrically connect to the electronic component 312 in the substrate 312 or the metal interconnection system 310 in the dielectric layer 308 through a via plug (not shown), thereto receive or transmit various input/output signal. As shown in FIG. 1, a second dielectric layer 304 is disposed on the first dielectric layer 302. The first dielectric layer 302 or the second dielectric layer 304 may be a single layer or a multi-layered structure, and the material thereof may generally be low-k material such as silicon dioxide ($SiO_2$), or a high-k dielectric material, such as hafnium oxide, HfO2, hafnium silicon oxide (HfSiO4), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalate ($SrBi_2Ta_2O_9$, SBT), lead zirconate titanate ($PbZr_xTi_{1-x}O_3$, PZT, barium strontium titanate ($Ba_xSr_{1-x}TiO_3$, BST), and is not limited thereto.

Figure 2:
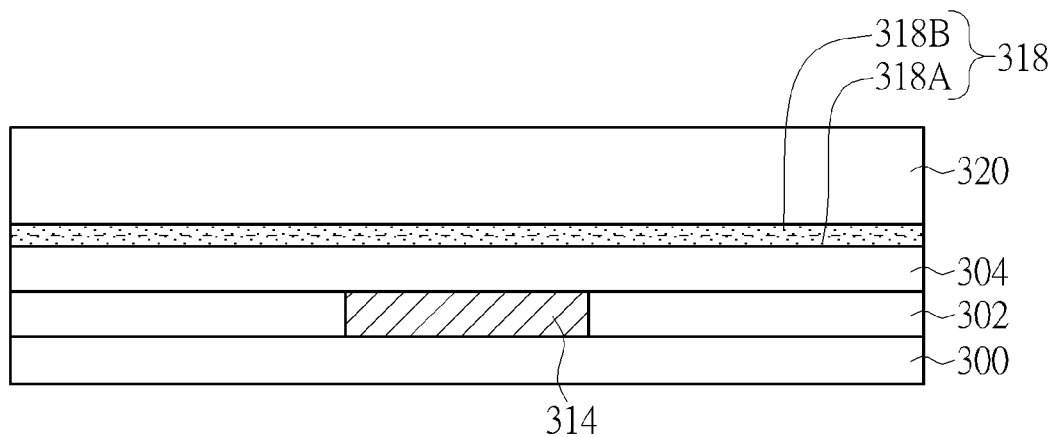

Please refer to FIG. 2. To describe the components in detail, FIG. 2 to FIG. 9 are show enlarged pictures according to the region A of FIG. 1. As shown in FIG. 2, an oxide semiconductor (OS) material layer 318 and a conductive material layer 320 are formed comprehensively on the second dielectric layer 304. The OS material layer 318 may be a single layer or a multilayered structure, wherein each may contain the same or different materials, e.g., indium gallium zinc oxide (InGaZnO), indium tin oxide (ITO), indium zinc oxide (IZO), cadmium tin oxide (CTO), aluminum zinc oxide (AZO), indium tin zinc oxide (ITZO), zinc oxide, cadmium oxide, hafnium oxide (HfO), indium gallium zinc magnesium oxide (InGaZnMgO), indium gallium magnesium oxide (InGaMgO) or indium gallium aluminum oxide (InGaAlO), and is not limited thereto. In one embodiment, as shown in FIG. 2, the OS material layer 318 comprises a first OS material layer 318A and a second OS material layer 318B, wherein the first OS layer 318A and the second OS layer 318B contain IGZO and the oxygen concentration of the first OS layer 318A is different from the that of the second OS layer 318B. In one embodiment, the first OS layer 318A servers as a barrier layer and the second OS layer 318B serve as the main channel. The conductive material layer 320 may comprise a variety of conductive materials. In one preferred embodiment, the conductive material layer 320 comprises gold (Au), silver (Ag), copper (Cu), aluminum (Al), molybdenum (Mo), titanium (Ti), tantalum (Ta), cadmium (Cd), a nitride thereof, an oxide thereof, alloys thereof, or a combination thereof.

Figure 3:
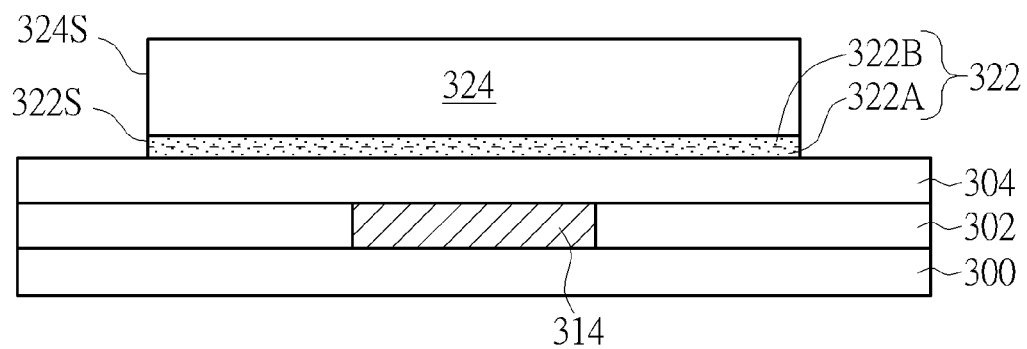

As shown in FIG. 3, the OS material layer 318 and the conductive material layer 320 are patterned to form a patterned OS layer 322 and a patterned conductive layer 324. In one embodiment, the patterned OS layer 322 comprises a first patterned OS layer 322A and a second patterned OS layer 322B. The patterning process may be carried out by one single photo-etching-process (PEP) or a plurality of PEPs. In one preferred embodiment of the present invention, the OS material layer 318 and the conductive material layer 320 are patterned by one single PEP, which uses the second dielectric layer 304 as an etch stop layer. Accordingly, the sidewall 322S of the patterned OS layer 322 and the sidewall 324S of the patterned conductive layer 322 are vertically aligned with each other. However, in another embodiment, the sidewalls 322S and 324S may not be vertically aligned. In one preferred embodiment, the patterned OS layer 322 is disposed correspondingly to the patterned conductive layer 314, for instance, the patterned OS layer 322 is disposed at a center of the patterned conductive layer 314.

Figure 4:
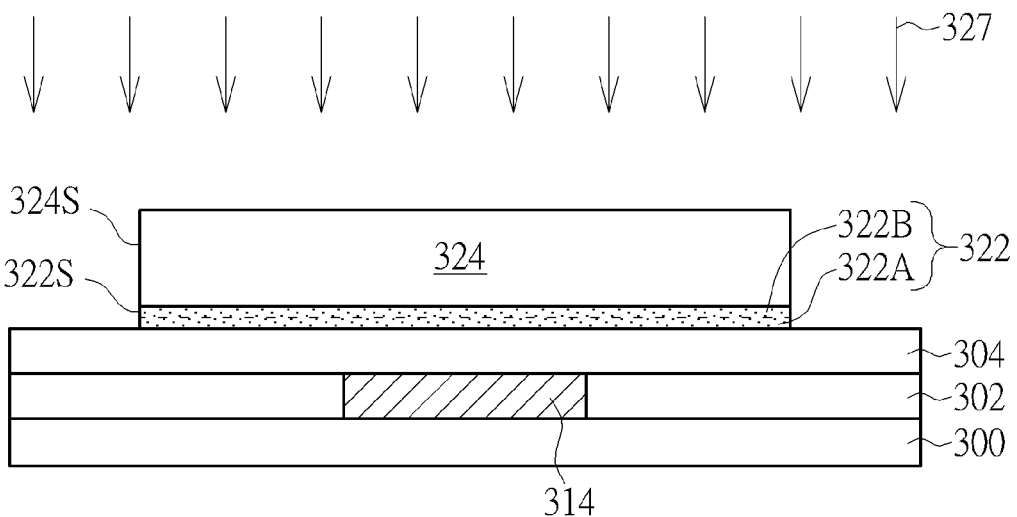

As shown in FIG. 4, an oxygen ambience treatment is performed. The oxygen ambience treatment may include an annealing process, a plasma treatment process or a chemical treatment process. In one embodiment, the annealing process includes supplying gas containing $O_2$ under 300° C. to 500° C., preferably 100% $O_2$ gas under 400° C. The plasma treatment process includes using plasma containing $O_2$. The chemical treatment includes using a chemical solvent containing $NH_4OH$, $H_2O_2$ and $H_2O$, such as $SC_1$ solvent. Through the oxygen ambience treatment 327, the patterned OS layer 322 can be tuned and the damage caused by the patterning process can be repaired. Thus, the possibility of oxygen vacancy can be decreased.

Figure 5:
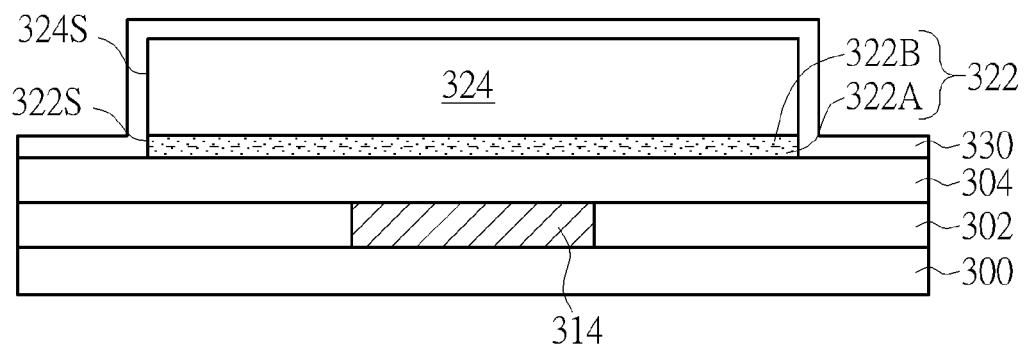

As shown in FIG. 5, a protective layer 330 is formed on the base 300. The protective layer 330 is preferably made of high-k dielectric material, for example, a metal oxide and more preferably is a rare earth metal oxide material, such as hafnium oxide, HfO2, hafnium silicon oxide (HfSiO4), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalate ($SrBi_2Ta_2O_9$, SBT), lead zirconate titanate ($PbZr_xTi_{1-x}O_3$, PZT, barium strontium titanate ($Ba_xSr_{1-x}TiO_3$, BST), and is not limited thereto. The protective layer 330 of the present invention preferably covers at least the sidewall 322S of the patterned OS layer 322 to prevent it from damage in the subsequent steps. In a first embodiment, as shown in FIG. 5, the protective layer 330 conformally cover the patterned OS layer 322 and the patterned conductive layer 324. In a second embodiment (not shown in FIG. 5), the protective layer 330 covers only the sidewall 322S of the patterned OS layer 322 and the sidewall 324S of the patterned conductive layer 324. In a third embodiment (not shown in FIG. 5), the protective layer 330 covers only the sidewall 322S of the patterned OS layer 322. In the first embodiment, the protective layer 330 is formed, for example, by a chemical vapor deposition (CVD) process so it will be formed conformally along the sidewalls 322S of the patterned OS layer 322, the sidewalls 324S of the patterned sidewall conductive layer 324 and the top surface of the patterned conductive layer 324. When forming the second embodiment or the third embodiment, the blanket protective layer can be subjected to an anisotropical removing process so the protective layer 330 forms an spacer structure with curved sidewalls, being disposed only at the sidewall 322S of the patterned OS layer 322 and the sidewall 324S of the patterned conductive layer 324, or only at the sidewall 322S of the patterned OS layer 322. For convenience of description, the following steps takes the first embodiment of the protective layer 330 for example, but one skilled in the art would also recognize that different structures will be formed in the following steps according to the second embodiment or the third embodiment.

Figure 6:
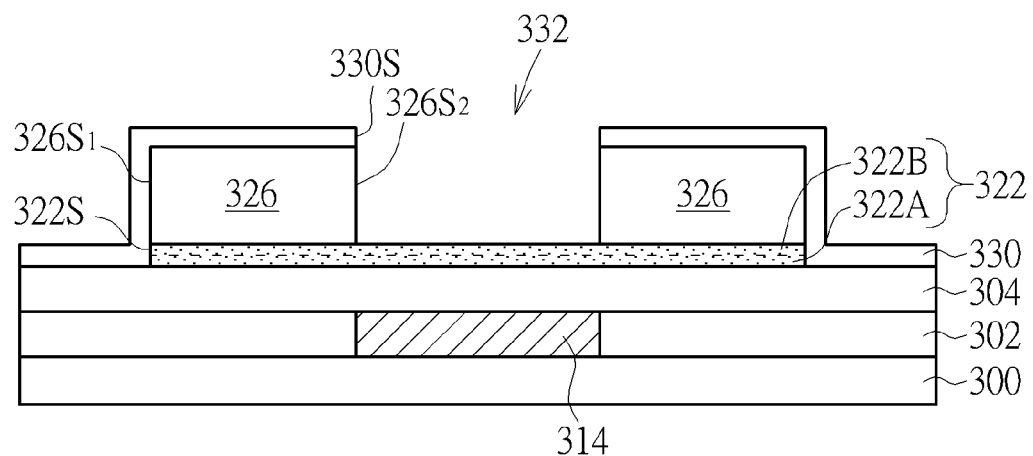

As shown in FIG. 6, the protective layer 330 and the patterned conductive layer 324 are patterned to form a recess 332 in the two layers. The recess 332 is preferably disposed in the middle of the patterned conductive layer 324 and the conductive layer 324 thereto divide them into two source/drain regions (S/D region) 326 with the same width. The patterning process may be carried out by one single PEP or a plurality of PEPs. In one preferred embodiment, it is carried out by one single PEP, so the inner sidewalls 326S2 of the S/D regions 326 are vertically aligned with the sidewall 330S of the protective layer 330, together forming the sidewall of the recess 332. On the other hand, as described above, the outer sidewalls 326S1 of the S/D region 326 are vertically aligned with the sidewalls 322S of the patterned OS layer 322.

Figure 7:
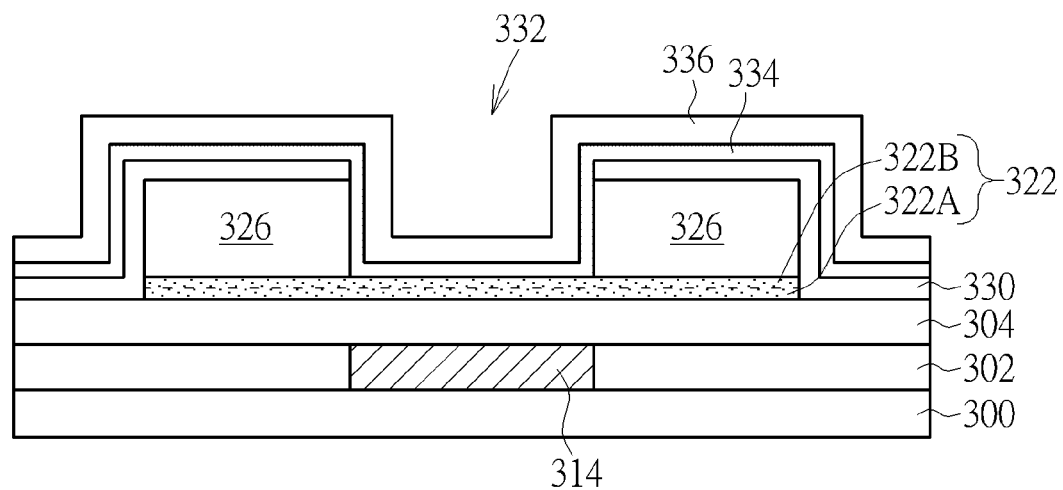

As shown in FIG. 7, a gate dielectric material layer 334 and a gate material layer 336 are formed conformally on the base 300. In one embodiment, the gate dielectric material layer 334 is a silicon dioxide layer or a high-k dielectric layer. The gate material layer 336 comprises a variety of conductive material, e.g., a metal layer comprising gold (Au), silver (Ag), copper (Cu), aluminum (Al), molybdenum (Mo), titanium (Ti), tantalum (Ta), cadmium (Cd), a nitride thereof, an oxide thereof, alloys thereof, or a combination thereof.

Figure 8:
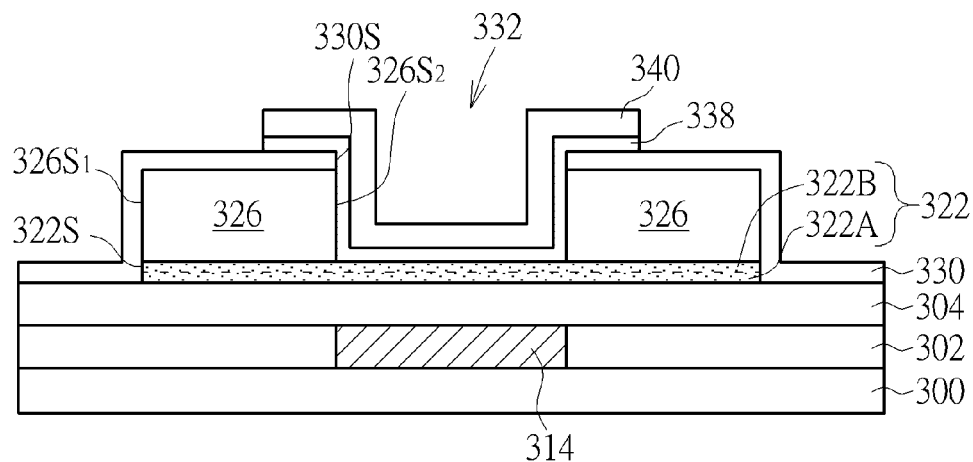

As shown in FIG. 8, the gate dielectric material layer 334 and the gate material layer 336 are patterned to respectively forma gate dielectric layer 338 and a gate electrode layer 340. In another embodiment, it is available to only pattern the gate material layer 336 without patterning the gate dielectric material layer 334. Accordingly, after the patterning process, the gate dielectric layer 338 still covers the protective layer 330 conformally.

Figure 9:
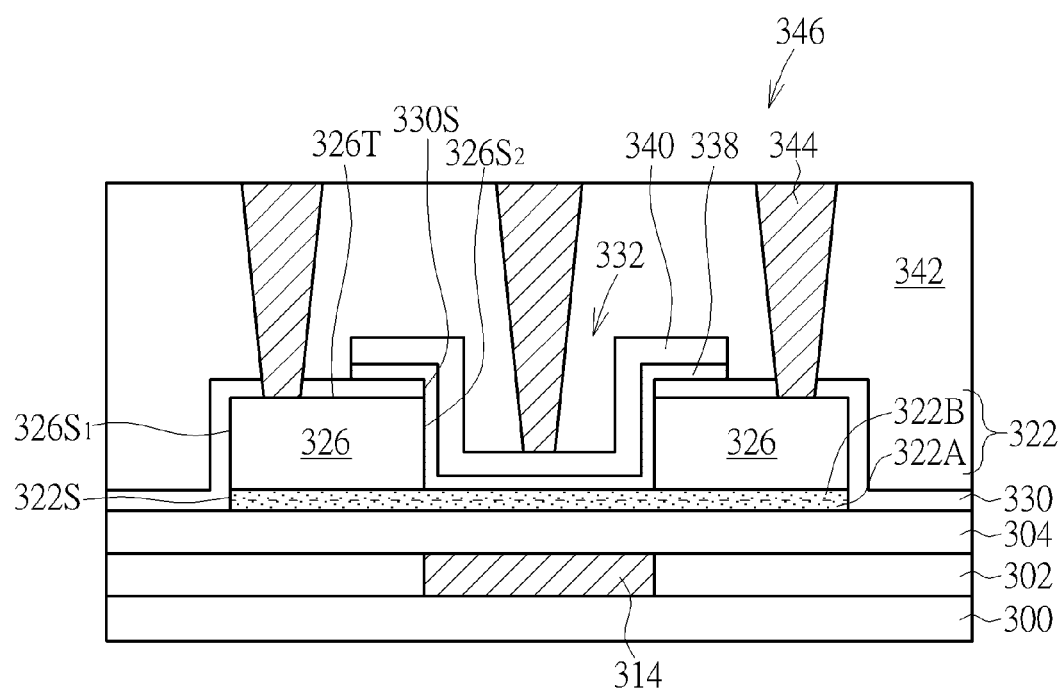

Subsequently, as shown in FIG. 9, a dielectric layer 342 is formed on the base 300 for covering the protective layer 330, the gate layer 340 and other structures. A plurality of via plugs 344 are formed in the dielectric layer 342 to electrically connect the S/D region 326 and the gate layer 340, respectively. In one embodiment, the via plug 344 may comprise an outer barrier layer such as titanium nitride (TiN), and an inside metal layer such as tungsten (W), but is not so limited. In the present embodiment, the via plug 344 penetrates through the protective layer 330 to electrically connect the S/D region 326. After the above steps, a semiconductor structure of the present invention is therefore obtained.

As shown in FIG. 9, the semiconductor structure 346 of the present invention includes a base 300, a patterned OS layer 322, two S/D regions 326, a protective layer 330, a gate dielectric layer 338 and a gate layer 340. A first dielectric layer 302, a patterned conductive layer 314 and a second dielectric layer 304 can be disposed between the base 300 and the patterned OS layer 322. A dielectric layer 342 can be disposed on the gate layer 340 and a plurality of via plugs 344 can be disposed therein. The semiconductor structure 346 of the present invention may have a dual gate transistor structure, for example, a C-axis aligned crystal OS MOSFET (CAAC-OS MOSFET), wherein the patterned conductive layer 314 is used as the bottom gate electrode, being separated from the second dielectric layer 304 by the patterned OS layer 322 which is used as the channel; the gate layer 340 is used as the top gate electrode, being separated from the gate dielectric layer 338 by the patterned OS layer 322 which is used as the channel. The present invention is characterized in that the two S/D regions 326 are separated by a recess 332 and each S/D region has an inner sidewall 326S1 facing the recess 332 and an outer sidewall 326S2 opposite to the inner sidewall 326S1. In addition, the protective layer 330 is disposed on the sidewall 322S of the patterned OS layer 322, the outer sidewall 326S1 of the S/D region 326S and a top surface 326T of the S/D region 326, but is not disposed on the inner sidewall 326S2 of the S/D region 326. The protective layer 330 can protect the patterned OS layer 322 and therefore improve its quality.

Figure 10:
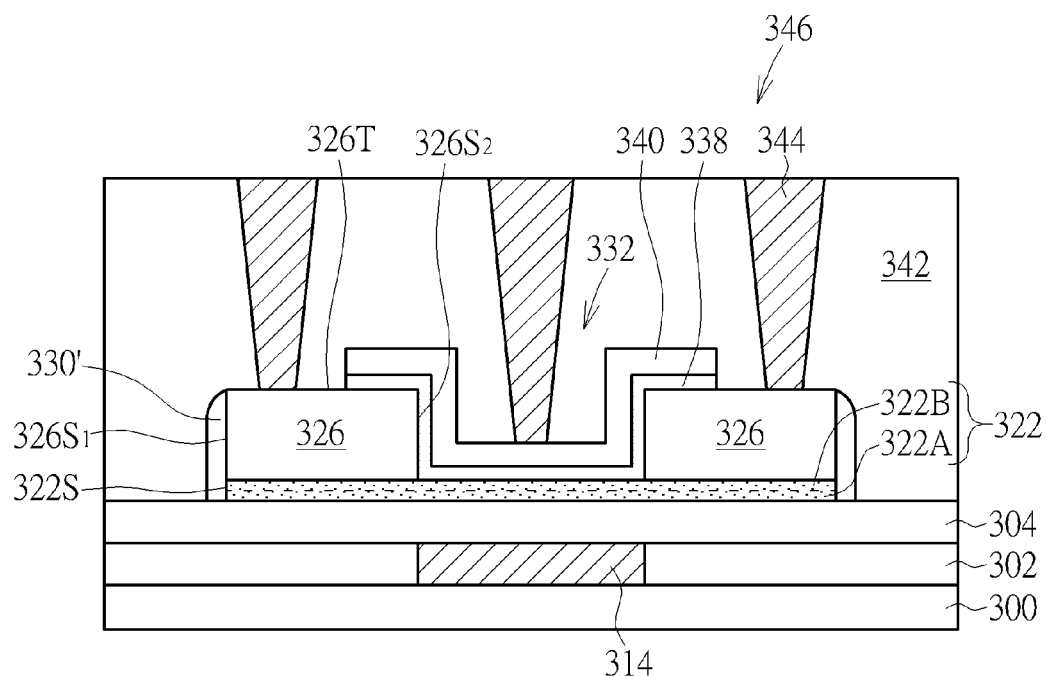
FIG. 10 and FIG. 11 show schematic diagrams of a semiconductor structure according to two embodiments of the present invention.
Figure 11:
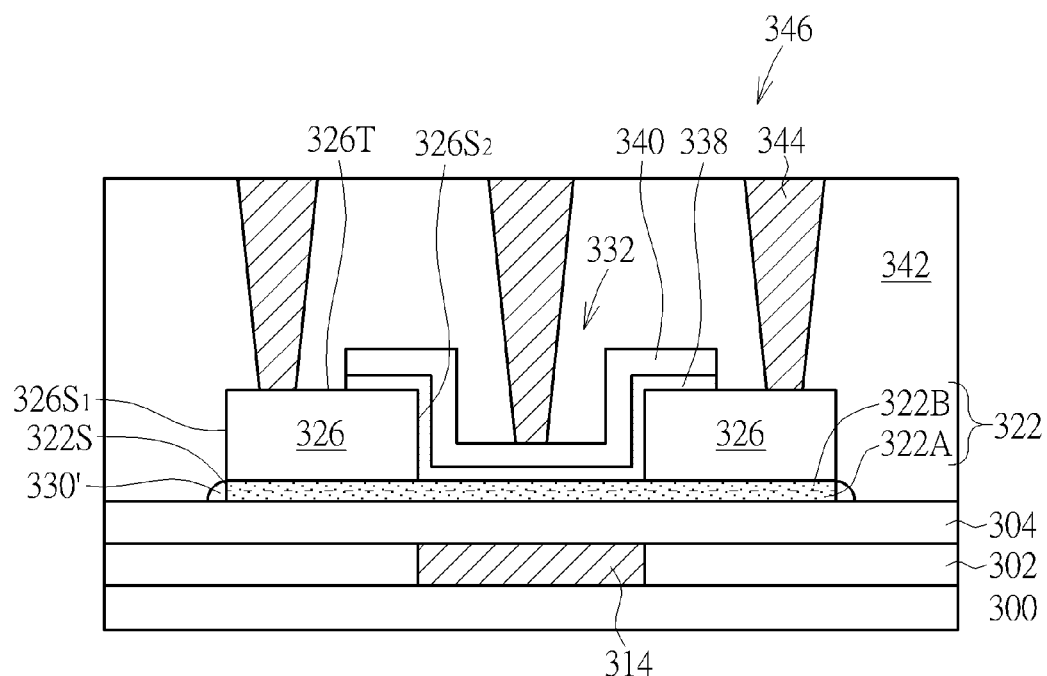

Please refer to FIG. 10 to FIG. 11, showing schematic diagrams of a semiconductor structure according to two embodiments of the present invention. When the protective layer 330 are formed in different positions as described in the second embodiment and the third embodiment, as shown in FIG. 10 (corresponding to the second embodiment), the protective layer 330' is disposed only on the sidewall 322S of the patterned OS layer 322 and the outer sidewall 326S1 of the S/D region 326, but is not disposed on the top surface 326T and the inner sidewall 326S2 of the S/D region 326. As shown in FIG. 11 (corresponding to the third embodiment), the protective layer 330" is disposed only on the sidewall 322S of the patterned OS layer 322.

Figure 12:
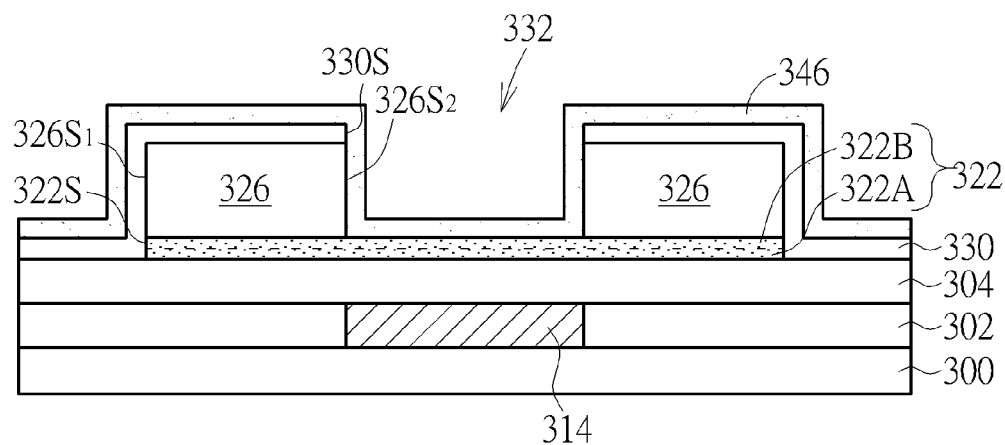
FIG. 12 and FIG. 13 show schematic diagrams of a semiconductor structure according to two embodiments of the present invention.
Figure 13:
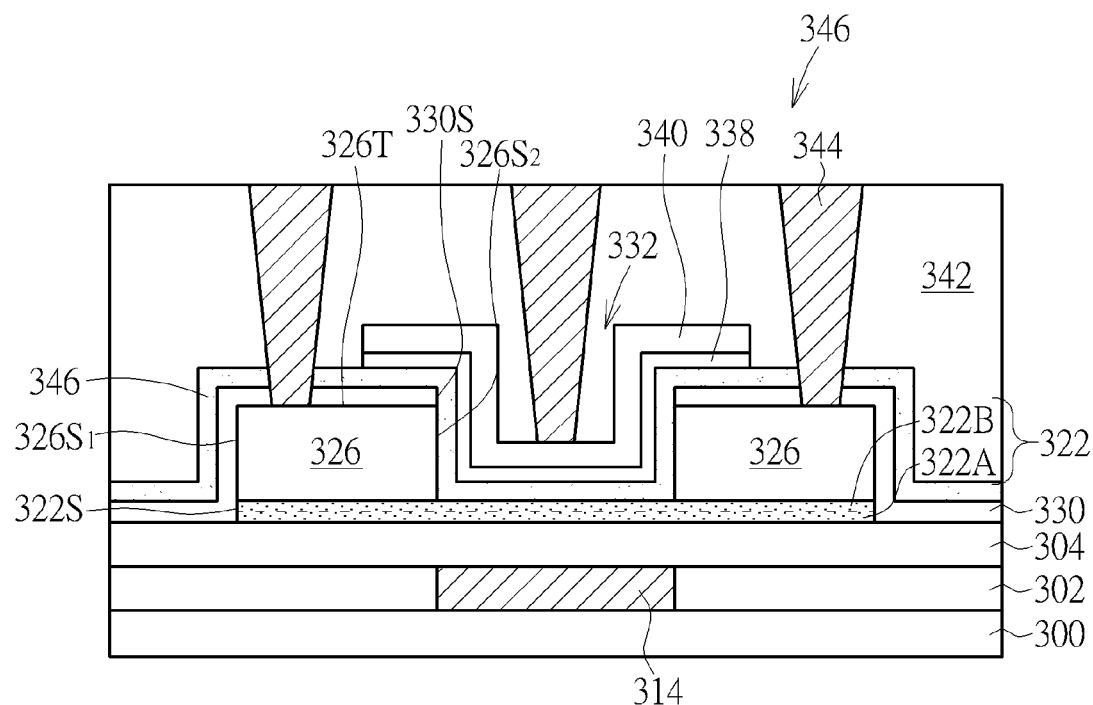

Please refer to FIG. 12, showing a schematic diagram of a method of forming a semiconductor structure according to one embodiments of the present invention, wherein the initial steps of this embodiment are similar to steps of FIG. 1 to FIG. 6 in the previous embodiment. After the steps in FIG. 1 to FIG. 6, as shown in FIG. 12, a second OS layer 346 is formed conformally on the base 300, covering the protection layer 330, the S/D regions 326 and the patterned OS layer 322. In one embodiment, the second OS layer 346 includes indium gallium zinc oxide (InGaZnO), indium tin oxide (ITO), indium zinc oxide (IZO), cadmium tin oxide (CTO), aluminum zinc oxide (AZO), indium tin zinc oxide (ITZO), zinc oxide, cadmium oxide, hafnium oxide (HfO), indium gallium zinc magnesium oxide (InGaZnMgO), indium gallium magnesium oxide (InGaMgO) or indium gallium aluminum oxide (InGaAlO), and is not limited thereto. The second OS layer 346 serves as a barrier layer in order to ensure the quality of the patterned OS layer 322. Subsequently, the steps shown in FIG. 7 to FIG. 9 can be carried out. In the final structure, as shown in FIG. 13, the second OS layer 346 is formed in the recess 330 and the protective layer 332. It is worth noting that the aforementioned embodiment can be incorporated into the first embodiment, the second embodiment or the third embodiment.

Figure 14:
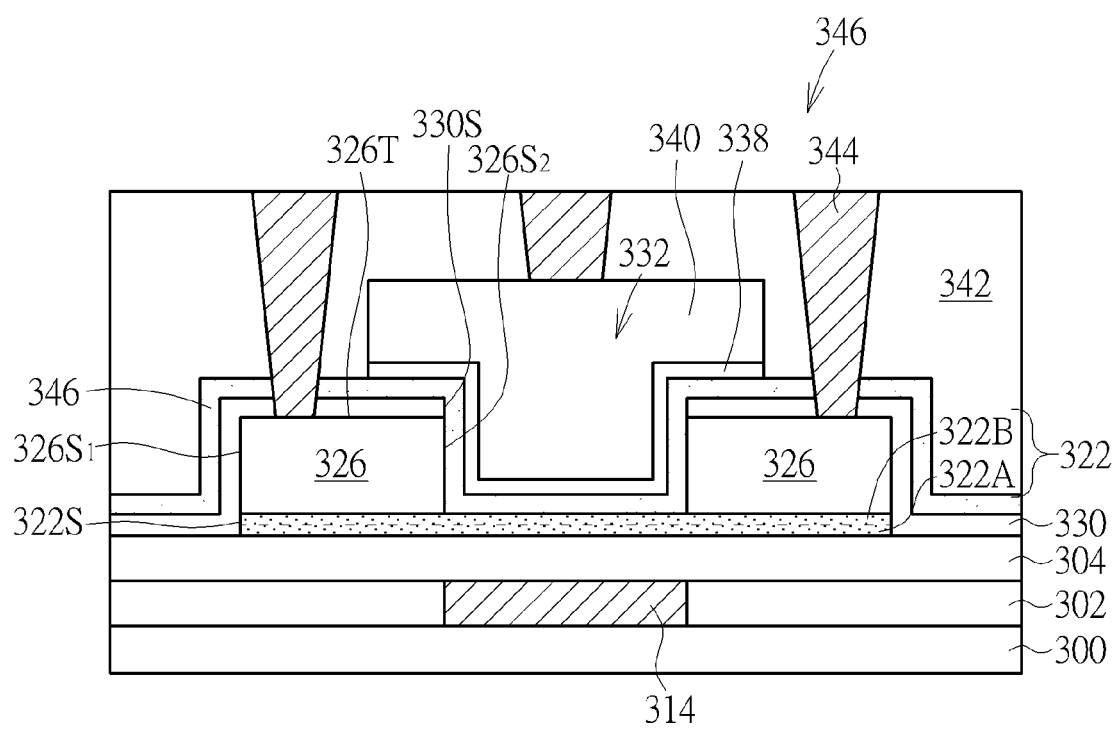
FIG. 14 show a schematic diagram of a semiconductor structure according to one embodiment of the present invention.

Please refer to FIG. 14, which shows a schematic diagram of a semiconductor structure according to one embodiment of the present invention. As shown in FIG. 14, in this embodiment, the gate 340 straddles over two S/D regions 326 such that the recess 332 is completely filled by the gate 340. It is also understood that the gate 340 may include other pattern or shape, depending on different designs.

In summary, the present invention provides a semiconductor structure, especially a semiconductor structure with a dual gate. It is one salient feature that an additional oxygen treating is performed thereto improve the quality of OS layer which is used as a channel. Thus, the oxygen-vacancy problem in conventional arts can be avoided. In addition, the present invention further provides the protective layer at sidewall of the OS layer thereto protect damage of the OS layer in the subsequent etching process, thereby improving the reliability of the products.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a patterned oxide semiconductor layer disposed on a base;
   two source/drain regions disposed on the patterned oxide semiconductor layer, wherein the two source/drain regions are separated by a recess, and each source/drain region respectively comprises an inner sidewall facing the recess and an outer sidewall disposed opposite to the inner sidewall;
   a protective layer disposed on a sidewall of the patterned oxide semiconductor layer, being not disposed on the inner sidewall of the source/drain region;
   a gate layer disposed on the patterned oxide semiconductor layer; and
   a gate dielectric layer disposed between the gate layer and the patterned oxide semiconductor layer.

2. The semiconductor structure according to claim 1, wherein the protective layer directly contacts the sidewall of the patterned oxide semiconductor layer.

3. The semiconductor structure according to claim 1, wherein the protective layer is further disposed on the outer sidewall of the source/drain region and a top surface of the source/drain region.

4. The semiconductor structure according to claim 3, wherein the protective layer has a sidewall vertically aligned with the inner sidewall of the source/drain region.

5. The semiconductor structure according to claim 1, wherein the protective layer is disposed only on the sidewall of the patterned oxide semiconductor layer.

6. The semiconductor structure according to claim 1, wherein the protective layer is disposed only on the sidewall of the patterned oxide semiconductor layer and the outer sidewall of the source/drain region.

7. The semiconductor structure according to claim 1, wherein the protective layer comprises a high-k dielectric material.

8. The semiconductor structure according to claim 1, wherein the patterned oxide semiconductor layer comprises a first patterned oxide semiconductor layer and a second patterned oxide semiconductor layer.

9. The semiconductor structure according to claim 1, further comprising a second oxide semiconductor layer disposed between the gate dielectric layer and the patterned oxide semiconductor layer.

10. The semiconductor structure according to claim 1, further comprising:
    a first dielectric layer disposed on the base;
    a first patterned conductive layer disposed in the first dielectric layer and corresponding to the gate layer; and
    a second dielectric layer disposed in the first dielectric layer.

* * * * *